United States Patent

Ishii

(10) Patent No.: US 9,383,638 B2
(45) Date of Patent: Jul. 5, 2016

(54) METHOD FOR GENERATING PATTERN, STORAGE MEDIUM, AND INFORMATION PROCESSING APPARATUS

(71) Applicant: CANON KABUSHIKI KAISHA, Tokyo (JP)

(72) Inventor: Hiroyuki Ishii, Shioya-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/321,669

(22) Filed: Jul. 1, 2014

(65) Prior Publication Data

US 2015/0017572 A1    Jan. 15, 2015

(30) Foreign Application Priority Data

Jul. 10, 2013 (JP) ................................. 2013-144757
May 23, 2014 (JP) ................................. 2014-107477

(51) Int. Cl.
*G06F 17/50* (2006.01)
*G03F 1/36* (2012.01)
*G03F 7/20* (2006.01)

(52) U.S. Cl.
CPC ... *G03F 1/36* (2013.01); *G03F 7/70* (2013.01)

(58) Field of Classification Search
CPC ......... G06F 17/5045; G03F 1/00; G03F 7/30; G03F 1/36
USPC ............................................... 716/53; 430/5
See application file for complete search history.

(56) References Cited

U.S. PATENT DOCUMENTS

| | | | | | |
|---|---|---|---|---|---|
| 5,682,323 | A | * | 10/1997 | Pasch | G03F 1/144 257/386 |
| 5,847,421 | A | * | 12/1998 | Yamaguchi | H01L 27/11803 257/202 |
| 7,987,435 | B2 | * | 7/2011 | Ogawa | G03F 1/144 716/51 |
| 8,885,917 | B2 | * | 11/2014 | Hsieh | G03F 1/36 382/144 |
| 2004/0205688 | A1 | * | 10/2004 | Pierrat | G06F 17/5068 716/53 |
| 2006/0184908 | A1 | * | 8/2006 | Minami | G03F 1/144 716/53 |
| 2009/0100396 | A1 | | 4/2009 | Smayling | |

* cited by examiner

*Primary Examiner* — Jack Chiang
*Assistant Examiner* — Brandon Bowers
(74) *Attorney, Agent, or Firm* — Canon USA, Inc., IP Division

(57) ABSTRACT

There is provided a method for generating a pattern. A pattern is generated by selecting a cell from a cell library including a plurality of cells, adding, to the interior of the selected cell, a second pattern different from a first pattern of the selected cell, performing a first optical proximity correction (OPC) onto the pattern of the selected cell including the first pattern and the second pattern, performing a second optical proximity correction onto a pattern of a plurality of cells in which the selected cell including first pattern and second pattern, which have been subjected to the first optical proximity correction, and another of the cells are proximately arranged and generating the pattern including the patterns of the plurality of cells which have been subjected to the second optical proximity correction.

12 Claims, 7 Drawing Sheets

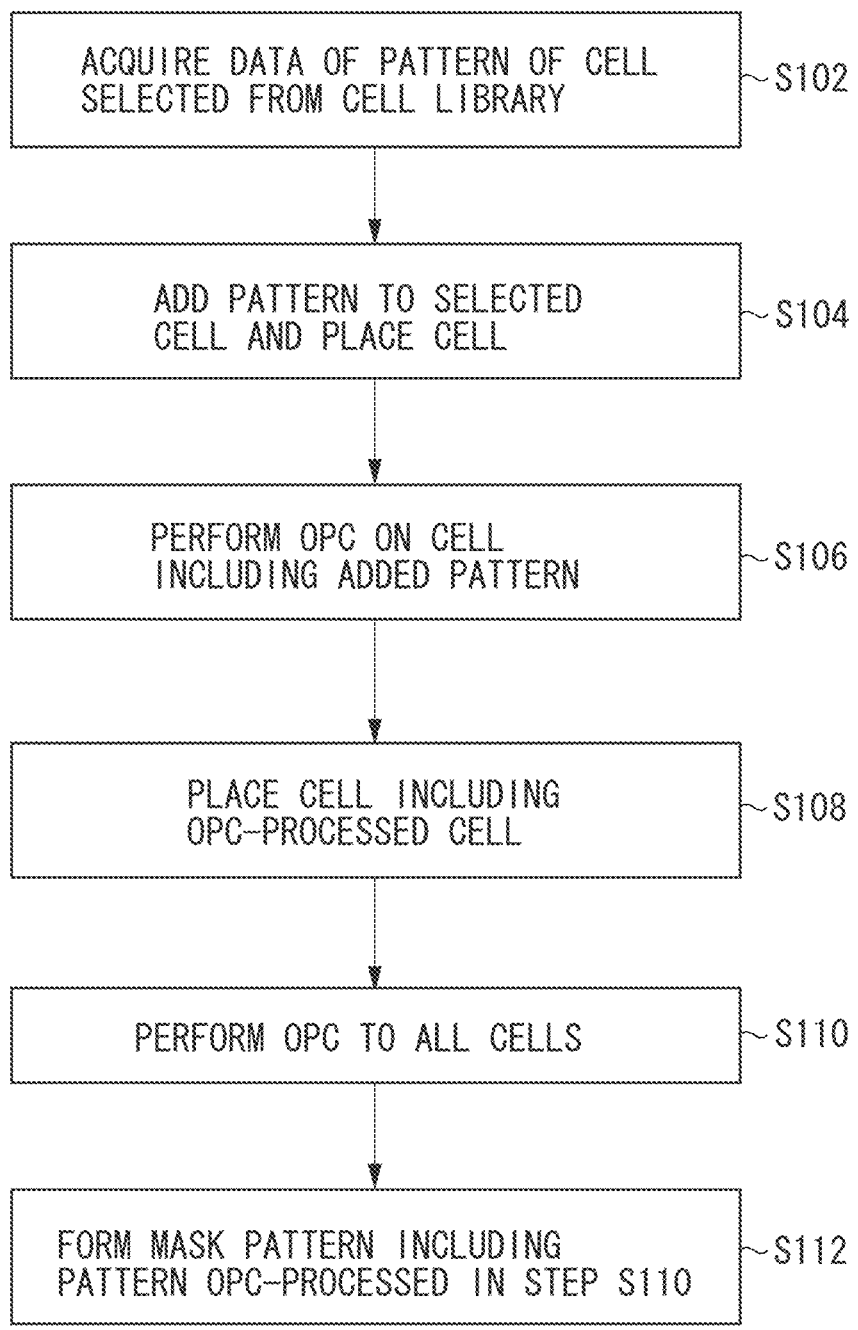

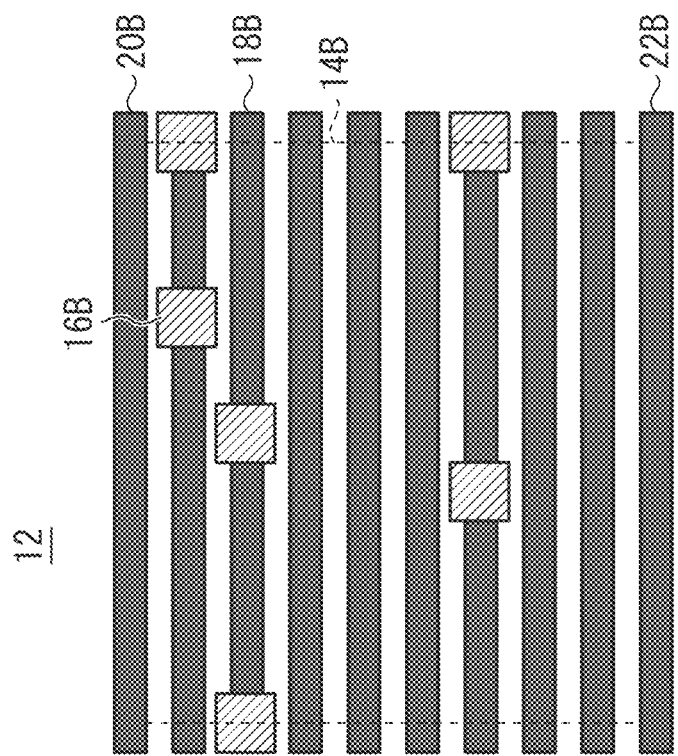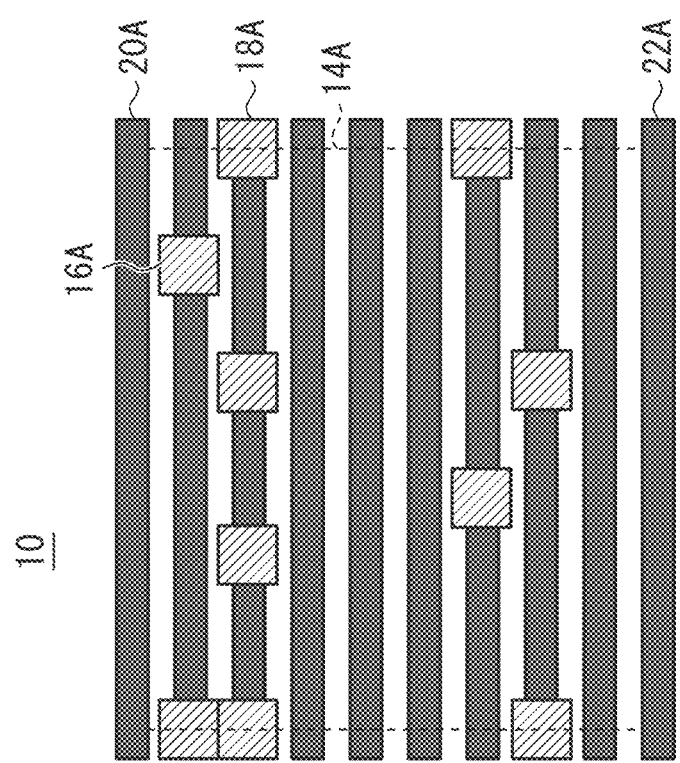

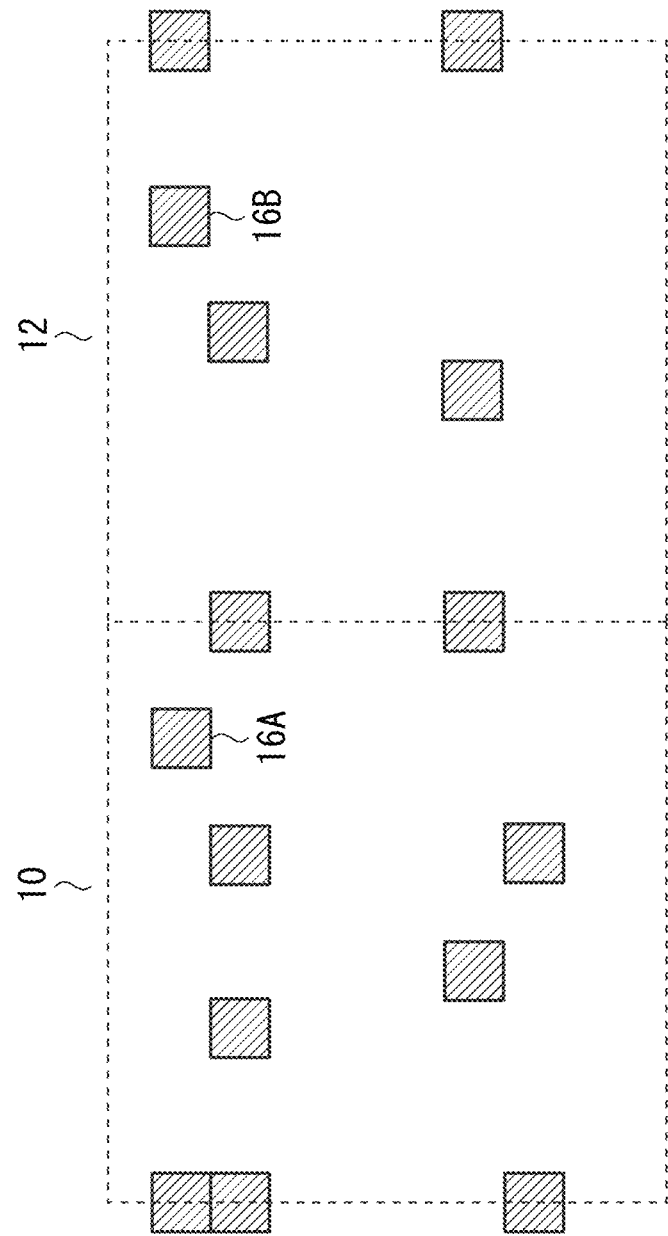

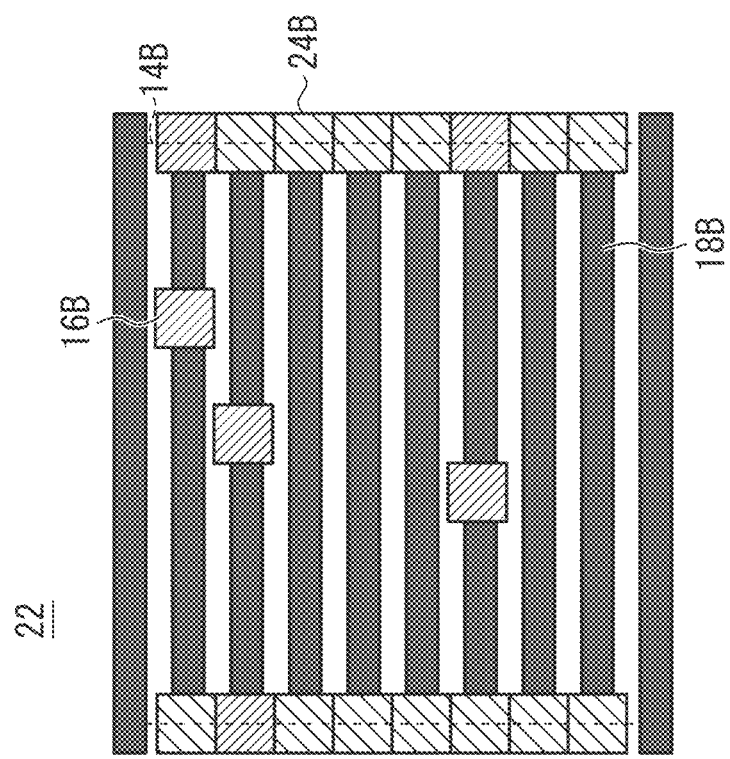
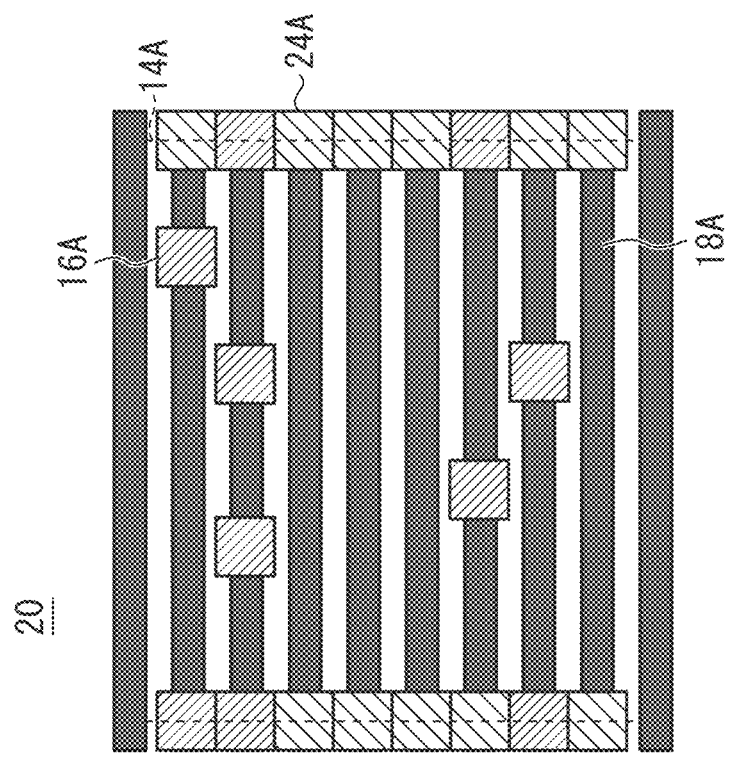

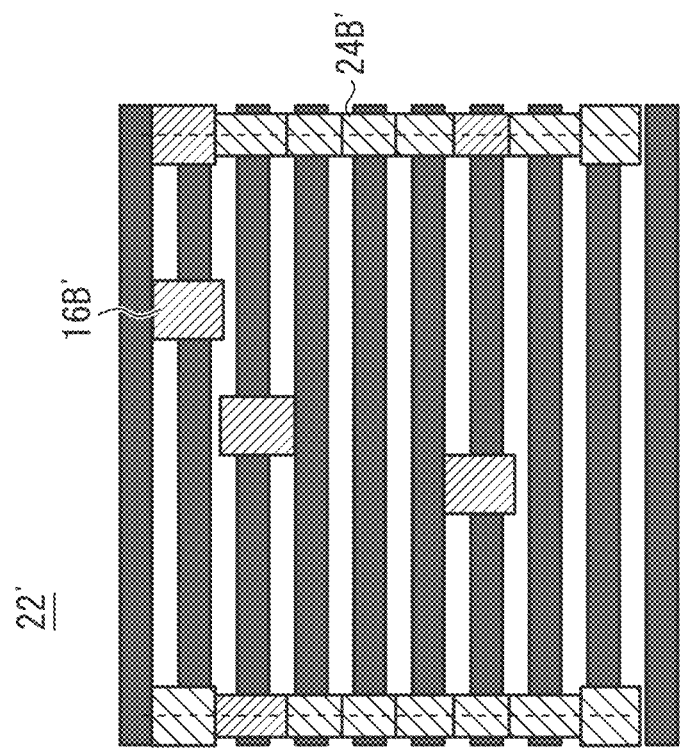
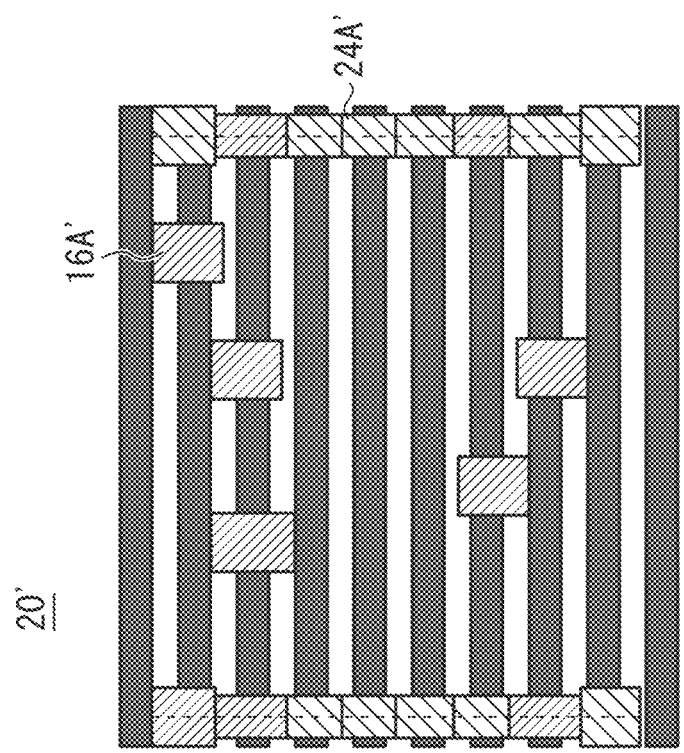

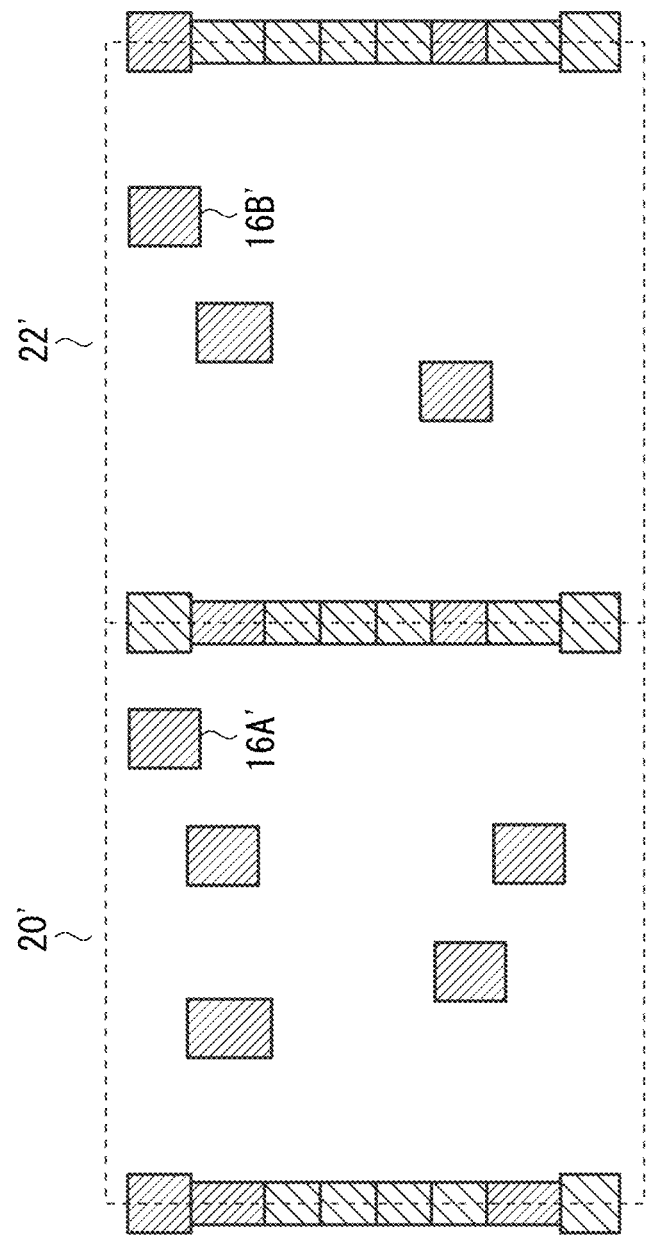

METHOD FOR GENERATING PATTERN, STORAGE MEDIUM, AND INFORMATION PROCESSING APPARATUS

BACKGROUND OF THE INVENTION

1. Field of the Invention

The present invention relates to a method for generating a pattern, a storage medium, and an information processing apparatus.

2. Description of the Related Art

In a lithography technique, an exposure apparatus including an illumination optical system for illuminating a mask with light from a light source and a projection optical system for projecting an image of a pattern of a mask on a substrate (e.g., a wafer) is used.

As a minimum size of a target pattern to be formed on a substrate becomes a size lower than the wavelength of the light from a light source to be used for exposure, when the mask pattern image is projected onto the substrate, unintended interactions occur between adjacent patterns. The interactions of the light from respective patterns in the mask generate interference fringes, and this causes formation of an unintended image of a shape different from the target pattern on the substrate. With the increase in the difference between the minimum size of the target pattern and the wavelength of the light source, the occurrence of the resolution failure of the pattern increases.

As a method for generating a mask pattern using a computer, there has been known a method for selecting and placing a plurality of cells from a cell library including many standard cells, and performing an optical proximity correction (OPC) on the pattern of the placed cells. In the OPC, in consideration of the effects on the image of the pattern due to the interactions of the light from adjacent patterns, a correction for changing the shape of each pattern element constituting the pattern is performed so that the image of the pattern is formed within a target range. The cell library includes a plurality of cells constituting basic patterns to be used as patterns of masks, and the respective cells have patterns different from each other.

Unfortunately, if the OPC is performed onto the entire mask pattern (full chip) after the generation of the pattern of the mask by placing all of the cells to be used, the calculations for changing the shape of the pattern elements increases as the number of the pattern elements increases. This largely increases the amount of calculation in the OPC. To solve the problem, United States Patent Application Publication No. 2009/0100396 discusses a method for correcting shapes of patterns by separately performing an OPC onto the pattern of each cell in advance, generating a mask pattern by placing the OPC-processed cells, and performing a finishing OPC onto the entire mask pattern. Through the processing, in the OPC processing to be performed onto the entire mask pattern, with respect to a part of the pattern elements, if the images of the pattern elements have already been within the target range as a result of the OPC processing performed onto the pattern of each cell, the OPC processing thereon can be eliminated. This can reduce the number of the pattern elements to be corrected, and as a result, the amount of calculation can be reduced.

Unfortunately, still the calculation amount in the OPC processing to be performed onto the entire pattern of the mask is large even if the method discussed in United States Patent Application Publication No. 2009/0100396 is used, and there is a need for further reduction in the calculation amount.

SUMMARY OF THE INVENTION

According to an aspect of present invention, a method is provided that is capable of reducing an amount of calculation required for optical proximity correction to be performed onto a pattern.

According to another aspect of the present invention, in a method for generating data of a pattern, a processor performs, selecting a cell from a cell library including a plurality of cells, adding, to the interior of the selected cell, a second pattern different from a first pattern of the selected cell, performing a first optical proximity correction onto the pattern of the selected cell including the first pattern and the second pattern, performing a second optical proximity correction onto patterns of a plurality of cells in which the selected cell including the first pattern and second pattern, which have been subjected to the first optical proximity correction and another of the cells are proximately arranged and, and generating the pattern including patterns of the plurality of cells which have been subjected to the second optical proximity correction.

Further features of the present invention will become apparent from the following description of exemplary embodiments with reference to the attached drawings.

BRIEF DESCRIPTION OF THE DRAWINGS

FIG. 1 is a flowchart illustrating a method for generating a mask pattern.

FIGS. 2A and 2B schematically illustrate standard cells 10 and 12.

FIG. 3 illustrates the standard cells 10 and 12 being adjacently placed.

FIGS. 4A and 4B illustrate cells 20 and 22 generated by adding respective second patterns to the standard cells 10 and 12 and placing the patterns.

FIGS. 5A and 5B illustrate cells 20' and 22' obtained by performing an OPC onto the cells 20 and 22.

FIG. 6 illustrates the cells 20' and 22' being adjacently placed.

DESCRIPTION OF THE EMBODIMENTS

Figure 7:
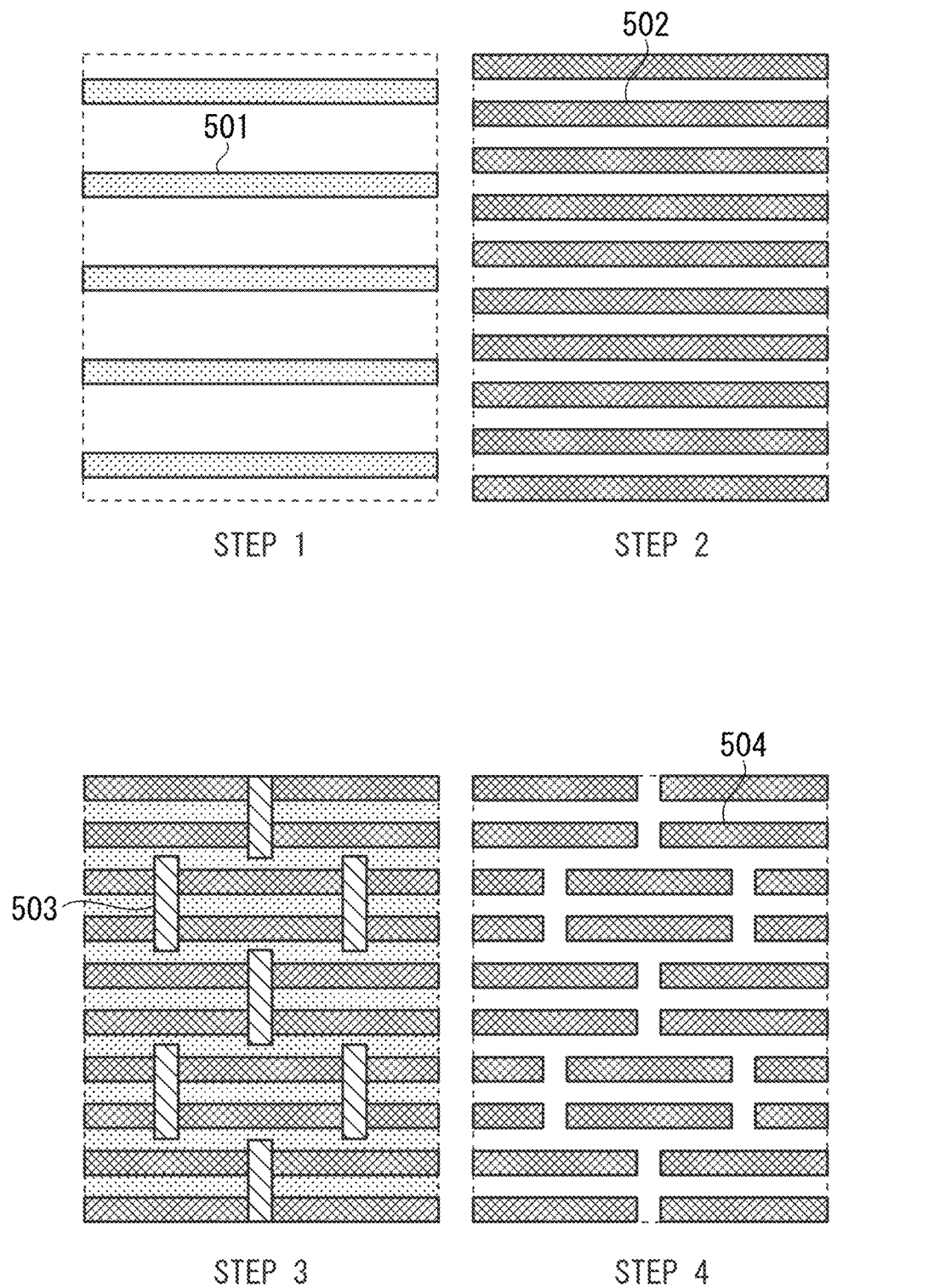
FIG. 7 illustrates a lithography technique using a one-dimensional layout.

Various exemplary embodiments, features, and aspects of the invention will be described in detail below with reference to the drawings.

A first exemplary embodiment relates to a lithography technique for manufacturing semiconductor devices. More specifically, the present exemplary embodiment relates to the data generation of a pattern of a mask to be used in an exposure apparatus for performing exposure of a substrate with an illumination optical system for illuminating the mask, and a projection optical system for projecting an image of the pattern of the mask onto the substrate.

The data generation of the pattern of the mask is implemented by a processing unit in a computer (for example, a central processing unit (CPU), a micro processing unit (MPU), a digital signal processor (DSP), and a field-programmable gate array (FPGA)) reading and executing a program and by the computer performing calculation using the data of the pattern. The software and the program implementing the functions of the present exemplary embodiment is supplied to an information processing apparatus including one or more computers via a network or various storage media. The program is executed by a processing unit of the information processing apparatus reading the program recorded or stored in a recording medium or a storage medium. Separately located computers can perform various kinds of processing of the program by sending and receiving data in wired or wireless communication. The processing unit in the information processing apparatus includes units for executing each step described below.

The information processing apparatus (computer) selects a plurality of cells from a cell library including many cells, determining a layout (chip layout) of a mask pattern by placing the selected cells, and performs an optical proximity correction on the pattern of the placed cells. Through the processing, the pattern of the mask corresponding to the target pattern to be formed on the substrate (e.g., a wafer) is generated.

First, the computer acquires data of a cell selected from the cell library including a plurality of cells. Then, the computer adds a second pattern to the first pattern of the selected cell and places the pattern. The computer performs an optical proximity correction onto the pattern including the first pattern and the second pattern. Using patterns of a plurality of the cells including the OPC-processed cell of the first pattern and the second pattern, the computer generates a pattern of the mask. Then, the computer further performs an optical proximity correction onto the generated mask pattern.

Hereinafter, the method for generating a mask pattern performed by the computer is described in more detail below. FIG. 1 is a flowchart illustrating the method for generating a mask pattern performed by the computer.

In step S102, the processing unit in the computer selects, from the cell library including a plurality of types of standard cells, a cell to be used for the generation of a pattern of a mask, and acquires the data of the pattern of the selected cell. The data may be pattern data of the cells selected from the cell library based on an instruction from an input unit by the user, or data of patterns of the cells automatically selected by the computer. The cell library is stored in a storage unit (memory) of the computer. The data of the cell can be acquired by reading the data from the storage unit storing the cell library. The cell includes a basic pattern to be used as a pattern of the mask. Generally, the cell library includes several tens to several hundreds of types of standard cells to be used as standard circuit patterns. In the description below, for the sake of simplicity, it is assumed that two types of standard cells are selected from the cell library.

FIGS. 2A and 2B schematically illustrate standard cells 10 and 12 to be used in a logic device. The standard cell 10 includes a cut pattern (first pattern) 16A including a plurality of quadrilateral figures (pattern elements). The standard cell 12 includes, similarly, a cut pattern (first pattern) 16B including a plurality of quadrilateral figures (pattern elements). The first pattern is indicated by right oblique lines. In the first pattern 16A of the standard cell 10 and the first pattern 16B of the standard cell 12, the shapes of the pattern elements are the same, and the layouts of the pattern elements are different from each other. However, the shapes of the pattern elements may differ from each other. The cut patterns are used as patterns for cutting layouts of patterns extending in one direction.

FIG. 7 illustrate a lithography technique (complementary lithography) using layout (also referred to as one-dimensional (1D) layout) of patterns extending in one direction. The 1-D layout enable the generation of a mask pattern without using pattern elements of complicated shapes such as an L-shaped pattern extending in both of the vertical direction and the horizontal direction, and this enables reduction in resolution failure in the mask pattern. The pattern element is used to form a pattern, and the pattern element is one independent figure. FIG. 7 illustrates patterns formed in the lithography process of a gate cell of a static random access memory (SRAM) of the 22 nm half-pitch generation. In step S1, using an exposure apparatus, a 44 nm half-pitch line and space (L/S) pattern 501 is formed on a substrate. In step S2, the pattern 501 formed on the substrate is formed directly or on a ground, and isotropic film formation is performed onto the entire surface. Then, anisotropic etching is performed to form a hard mask of a 22 nm half-pitch L/S pattern 502 with the film remaining on the side walls (outline) of the pattern 501. In step S2, a so-called double patterning technique using the side walls is used. In step S3, on the L/S pattern 502, a resist is applied, and the image of a hole pattern 503 for cutting the L/S pattern 502 is projected onto the resist to be developed. In step S4, the anisotropic etching is performed again to cut the lines in the L/S pattern 502 by the hole pattern 503, and thereby the hard mask of a gate cell pattern 504 including only the pattern extending in one direction is formed.

The 1-D layout can be applied similarly to patterns of logic devices. With respect to gate cells of SRAMs and logic devices, there is a plurality of types of cut patterns for cutting a line pattern.

FIGS. 2A and 2B illustrate L/S patterns 18A and 18B for reference. The L/S patterns 18A and 18B are formed on a substrate (e.g., a wafer) in a preceding step of the cut pattern step, and the patterns are cut by a cut pattern. FIGS. 2A and 2B also illustrate power source lines 20A and 20B and ground lines 22A and 22B having a shape similar to respective lines of the L/S patterns 18A and 18B.

The L/S patterns, the power source lines, and the ground lines are periodic patterns having the periodically arranged lines extending in one direction, and used for one-dimensional layout. However, the L/S patterns, the power source lines, and the ground lines are illustrated for convenience, and not included in the standard cell 10 and the standard cell 12. The L/S patterns 18A and 18B are cut in the areas overlapping with the cut patterns. On the other hand, the power source lines and the ground lines are not cut by the cut patterns since the lines are to be used without being cut. Dotted lines 14A and 14B are boundary lines indicating the ranges (outer frames) of the cells. As illustrated in FIG. 3, when the mask pattern is generated, the boundary lines of the cells overlap with each other if the standard cell 10 and the standard cell 12 are adjacently or proximately placed. In some cases, the cut pattern of the standard cell 10 and the cut pattern of the standard cell 12 overlap with each other on the boundary line.

In step S104, to each of the standard cell 10 and the standard cell 12, a pattern (second pattern) different from the first pattern is added and placed. FIGS. 4A and 4B illustrate a cell 20 generated by adding the second pattern to the standard cell 10, and a cell 22 generated by adding the second pattern to the standard cell 12. The added second patterns are indicated by left oblique lines. To the standard cell 10, the second pattern 24A is added to generate the cell 20, and to the standard cell 12, the second pattern 24B is added to generate the cell 22. The second patterns are generated to have the same size as the first patterns, and to have the quadrilateral isolated patterns. The addition and placement of the second patterns are performed for a purpose different from the correction of the optical proximity effect to the first patterns. The OPC to the second patterns and the first patterns is performed in step S106 described below.

Both of the second patterns 24A and 24B are placed on the boundary lines extending in the direction perpendicular to the direction the L/S patterns 18A and 18B extend, respectively.

At each of the left and right boundary lines, the second patterns 24A and 24B are placed at positions other than the cut patterns 16A and 16B so that the cut patterns 16A and 16B and the second patterns 24A and 24B form line-shaped patterns (figures), respectively.

In the 1-D layout, cut patterns required to cut the line patterns 18A and 18B are used. Therefore, in the known techniques, in the standard cell 10 and the standard cell 12, there are only the cut patterns 16A and 16B (the first patterns). Different from the known techniques, in the present exemplary embodiment, in addition to the cut patterns 16A and 16B (the first patterns), dummy second patterns, which is not essential, are added. At the portions where the second patterns are placed, essentially, it is not necessary to cut the line patterns 18A and 18B that have been formed on the substrate. When the second patterns are resolved on the substrate, however, the line patterns are cut by the second patterns. At the portions on the boundary lines of the cells, even if the line patterns are cut, there is no problem since the line patterns are not required to be connected with each other around the boundary lines of the neighboring cells in the layout generating processing of the pattern of the mask. In other words, the line patterns at the portions do not affect the operation of the device formed on the substrate. In the present exemplary embodiment, at the positions of the boundary lines on the cells, all of the line patterns 18A and 18B are cut.

In step S106, to cells containing the first pattern and the added second pattern, the OPC processing is individually performed. In the OPC, in consideration of the effect (optical proximity effect (OPE)) on the image of the pattern due to the interactions of the light from adjacent patterns, a correction for changing the shape of each pattern element (figure) is performed so that the image of the pattern is formed within a target range. The OPC can be a rule-based OPC or a model-based OPC, or can be any known correction methods. FIGS. 5A and 5B illustrate cells 20' and 22' generated as a result of the OPC performed onto the cell 20 and the cell 22. The shapes of the cut patterns 16A and 16B, and the second patterns 24A and 24B are corrected, and the cut patterns 16A' and 16B', and the second patterns 24A' and 24B' are generated. In United States Patent Application Publication No. 2009/0100396, for each cell, the OPC is performed in advance, however, the optical proximity effect of the second pattern and the first pattern is not considered since the OPC is performed only onto the patterns (the first patterns) required for the cutting step, and the second patterns according to the present exemplary embodiment are not added and placed.

The OPC is performed onto each cell, however, as long as there is provided a pair of cells to be used in combination in the mask pattern generation, in consideration of the optical proximity effect caused by each of the cells of the pair, the OPC can be performed onto the cell pair. It is preferable that the shapes of the OPC-processed patterns on the cell boundary lines are to be the same shape for the cells that can be adjacently placed in the cell layout. This is because the patterns on the cell boundary lines are placed overlapping with the adjacent cells as a result of the cell placement. Therefore, before and after the cell placement, if the shapes differ from each other, the optical proximity effect between the patterns inside (inside the boundary lines) of the cells and the patterns on the boundary lines changes. Generally, it is convenient if the patterns on the cell boundary lines of all cells have the same shape, and the patterns are symmetrically placed with respect to the boundary line. For this reason, in step S106, the OPC is performed onto the patterns containing the first patterns and the second patterns so that the patterns on the individual boundary lines of the cells have the same shape. This processing enables the patterns on the cell boundary lines to have the same shape even if any cells are adjacent to each other, and special management of the pattern shape on the cell boundary lines can be eliminated.

In step S108, the cells containing the OPC-processed cells 20' and 22' are placed according to the circuit design of the device chip to be manufactured to generate the layout (chip layout) of the mask pattern. FIG. 6 illustrates the cells 20' and 22' which are adjacently placed at the boundary line. Although, in an actual mask layout, many cells are vertically and horizontally connected and placed, for the sake of simplicity, in this drawing, they are omitted. The patterns overlap with each other since the pattern shape on the right boundary line of the cell 20' and the pattern shape on the left boundary line of the cell 22' correspond to each other.

In step S110, an OPC (OPC at the full chip level) is performed onto the patterns of the cells placed as the pattern of the mask. In this processing, since the OPC processing has been individually performed onto each of the cells, and the second patterns added to the cell boundary lines have been placed, as compared to the known techniques, the calculation amount for the OPC to the mask pattern in step S110 can be reduced. Since the OPC processing has been individually performed onto each of the patterns of the cells, in the OPC at the full chip level, with respect to a part of the pattern elements, if the projection images of the elements have already been formed within the target range, the correction processing can be eliminated. This can reduce the number of the pattern elements to be corrected, and the number of parts of the pattern elements to be partially changed. As a result, the calculation time required for the OPC of the pattern of the mask can be reduced.

The reason of the reduction in the correction amount by the OPC in step S110 because of the placement of the second patterns on the cell boundary line will be described below. As illustrated in FIG. 6, in the layout of the mask having the adjacently placed cells 20' and 22', the first pattern of the cell 20' is subjected to the optical proximity effect due to the other patterns. More specifically, the first pattern of the cell 20' is affected by the optical proximity effect due to the first pattern in the cell 20', the optical proximity effect due to the second pattern added to the cell 20', and the optical proximity effect due to the pattern of the cell 22'. The optical proximity effect due to the first pattern and the second pattern in the cell 20' has been already corrected by the OPC to the cell 20 in step S106. Therefore, in the OPC in step S110, mainly, the correction of the optical proximity effect due to the pattern of the cell 22' is performed. The second pattern in the cell 20' increases the absolute amount in the optical proximity effect to the first pattern. However, the second pattern decreases the relative amount in the optical proximity effect due to the pattern of the cell 22' which is relatively distant with respect to the second pattern. This is because, generally, the effect of the optical proximity effect decreases as the distance between the patterns increased. As described above, the optical proximity effect due to the pattern of the cell 22' which is relatively distant is reduced, and the effect in the optical proximity effect due to the relatively close second pattern of the cell 20' itself becomes dominant. As a result, the amount of change in the shape of the pattern of the cell 20', the number of the pattern elements to be changed in the shape, and the number of parts of the pattern elements to be partially changed in the shape by the OPC in step S110 can be reduced. The same thing can be said with respect to the pattern of the cell 22' by the OPC in step S110.

In step S112, a pattern containing the patterns OPC-processed in step S110 is generated as a final pattern of the mask.

The pattern of the mask to be generated may include patterns other than the pattern generated in the above-described steps, for example, an alignment mark pattern.

As described above, according to the present exemplary embodiment, the calculation amount required for the optical proximity correction of the pattern of the mask in step S110 can be reduced.

In the present exemplary embodiment, each of the pattern shapes on the cell boundary lines is, as illustrated in FIGS. 4A and 4B, one vertically and horizontally symmetric sequential pattern. Alternatively, the symmetry may be lost and a discontinuous pattern may be used. It is not always necessary to generate the shape of the patterns on the cell boundary lines to be a unified shape in one cell library, and for convenience, it is preferable to generate the patterns to have similar shapes in the cells that can be adjacent to each other as much as possible. The second patterns to be added and placed to the cells can be placed, not only on the cell boundary lines, but at corresponding positions on lines that do not affect the operation of the device to be manufactured by being subjected to cutting processing. For example, on a line that do not affect the operation of the device, the second pattern can be placed at a position slightly inside the boundary line of cell, or at a position the resolution performance with respect to the first pattern of the cell can be increased. In the exposure processing, the image of the second pattern is resolved on the substrate and formed on the substrate. However, it is not always necessary to resolve the second pattern, and alternatively, the second pattern can function as an auxiliary pattern, which is not resolved, for helping the resolution of the first pattern.

In the present exemplary embodiment, the patterns of the cells selected from the cell library are the cutting patterns for the layouts including patterns extending in one direction. The use of the patterns is not limited to the above-described use. For example, the patterns can be applied to the other patterns, for example, a hole pattern for connecting line patterns.

In the present exemplary embodiment, in the optical proximity correction, light intensity distribution on a pupil plane in the illumination optical system for illuminating a mask can be considered. For example, the shape of a pattern can be changed while the illumination shape is changed, and the image of the pattern can be calculated and evaluated. Through this processing, an optimum pattern and an optimum illumination shape can be defined.

In a second exemplary embodiment, a pattern of a cell to be included in the cell library is generated. In the first exemplary embodiment, in step S106, the OPC is performed onto the pattern of the cell to which the second pattern is added. In the present exemplary embodiment, similarly to the first exemplary embodiment, the processing in steps S102, S104, and S106 is performed to generate a pattern of the OPC-processed cell. In the present exemplary embodiment, however, the processing after step S108 is not performed, and the cell on which the OPC has been performed in step S106 is registered as a new cell in the cell library to generate a new cell library. Similarly to the first exemplary embodiment, the method for generating a pattern of a cell is performed by a computer executing a program.

The generated new cell library is separately registered in an application (software) for generating a pattern of a mask, and used in generating a mask pattern. For example, using the application (software) for generating a pattern of a mask, patterns of cells generated according to the generation method according to the present exemplary embodiment and registered in the new cell library is selected from the cell library. The selected cells are placed to generate a layout of the mask, and an OPC is performed. In other words, the steps before step S106 and the steps after S108 can be performed in the different applications.

The mask pattern generated according to one of the above-described exemplary embodiments is data-converted according to a data format of data to be input to a mask manufacturing apparatus (drawing apparatus), and the data is input to the mask manufacturing apparatus. Based on the input data, the mask manufacturing apparatus draws a pattern on a mask blank, and thus a mask is manufactured.

The manufactured mask is carried in an exposure apparatus. The exposure apparatus illuminates the manufactured mask with light under set exposure conditions (e.g., an illumination shape, an amount of exposure, and a stage moving speed) to project the image of the pattern of the mask on a photosensitive material (resist) on a wafer to subject the photosensitive material to exposure.

A method for manufacturing devices (e.g., semiconductor integrated circuit (IC) devices, and liquid crystal display devices) using the above-described exposure method is described. The devices are manufactured, by a step of exposing a substrate (e.g., a wafer, and a glass substrate) on which a photosensitive material is applied to light using the above-described exposure method, a step of developing the substrate (photosensitive material), and the other known steps. The other known steps include, for example, etching, resist stripping, dicing, bonding, and packaging. In this device manufacturing method, as illustrated in FIG. 7, the lithography technique using 1-D layout can be used. According to the device manufacturing method, devices of higher quality can be manufactured.

According to the above-described exemplary embodiments, generating the mask pattern used for the exposure apparatus has been described. However, the present invention is not limited thereto, and the present invention can be applied to the generation of a pattern used for drawing (control data) on a substrate by using an electron beam exposure apparatus. The electron beam exposure apparatus controls a drawing position of an electron beam based on pattern data to draw the pattern on the substrate. As an OPC in the pattern generation method described above, in the electron beam exposure apparatus, there is an optical proximity effect to be corrected that affects the pattern other than the position to which the electron beam is projected.

Other Embodiments

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

The preferred exemplary embodiments have been described above. However, the present invention is not limited thereto, and can be modified in various ways without departing from the technical thought or essential features thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-144757 filed Jul. 10, 2013, and NO. 2014-107477 filed May 23, 2014, which are hereby incorporated by reference herein in their entirety.

What is claimed is:

1. A method for generating a mask pattern used for a mask manufacturing method for manufacturing the mask using data of the generated mask pattern, the method comprising the following steps performed by a processor:
   selecting a cell from a cell library including a plurality of cells;
   adding, to the interior of the selected cell, a second pattern different from a first pattern of the selected cell;
   performing a first optical proximity correction onto the pattern of the selected cell including the first pattern and the second pattern;
   performing a second optical proximity correction onto patterns of a plurality of cells in which the selected cell including the first pattern and the second pattern, which have been subjected to the first optical proximity correction, and another of the cells are proximately arranged; and
   generating the pattern including the patterns of the plurality of cells which have been subjected to the second optical proximity correction,
   wherein the mask manufacturing method comprises a step of manufacturing the mask including the generated pattern using data of the generated pattern,
   wherein the first pattern and the second pattern of the manufactured mask are resolved on a line pattern extending in one direction formed on a substrate,
wherein the line pattern is cut by the resolved first pattern and the resolved second pattern.

2. The method according to claim 1, wherein in the adding, the second pattern is placed on a boundary line defining a range of the cell.

3. The method according to claim 2, wherein in the adding, the second pattern is placed in the direction along the boundary.

4. The method according to claim 2, further comprising:
   performing the adding and the performing the first optical proximity correction onto each of the cells having different first patterns to generate the cells including the first patterns and second patterns, which have been subjected to the first optical proximity correction,
   wherein, in the performing the second optical proximity correction, the second optical proximity correction is performed onto the pattern including the first pattern and the second pattern of each of the cells so that the patterns on the individual boundary lines of the cells have the same shape.

5. The method according to claim 1, wherein in the adding, pattern elements of the second pattern are placed on boundary lines perpendicular to the line pattern in the boundary lines defining the range of the cell.

6. A mask manufacturing method comprising:
   generating data of a mask pattern using the method according to claim 1, and
   manufacturing the mask using the generated data of the mask pattern.

7. An exposure method comprising:
   manufacturing a mask using the mask manufacturing method according to claim 6; and
   exposing a substrate using the manufactured mask.

8. A device manufacturing method comprising:
   exposing a substrate to light using the exposure method according to claim 7; and
   developing the exposed substrate.

9. A non-transitory computer-readable storage medium storing a program for instructing a processor to execute the method according to claim 1.

10. An information processing apparatus, the apparatus comprising a processor,
   the processor configured to generate a mask pattern used for a mask manufacturing method for manufacturing the mask using data of the generated mask pattern,
   wherein the processor
   select a cell from a cell library including a plurality of cells;
   add, to the interior of the selected cell, a second pattern different from a first pattern of the selected cell;
   perform a first optical proximity correction onto the pattern of the selected cell including the first pattern and the second pattern;
   perform a second optical proximity correction onto patterns of a plurality of cells in which the selected cell including the first pattern and the second pattern, which have been subjected to the first optical proximity correction, and another of the cells are proximately arranged; and
   generate the pattern including the patterns of the plurality of cells which have been subjected to the second optical proximity correction,
   wherein the mask manufacturing method comprises a step of manufacturing the mask including the generated pattern using data of the generated pattern,
   wherein the first pattern and the second pattern of the manufactured mask are resolved on a line pattern extending in one direction formed on a substrate,
   wherein the line pattern is cut by the resolved first pattern and the resolved second pattern.

11. A method for generating a pattern used for an exposure method for exposing a substrate to light by an electron beam exposure apparatus using data of the generated pattern, the method comprising the following steps performed by a processor:
   selecting a cell from a cell library including a plurality of cells;
   adding, to the interior of the selected cell, a second pattern different from a first pattern of the selected cell;
   performing a first optical proximity correction onto the pattern of the selected cell including the first pattern and the second pattern;
   performing a second optical proximity correction onto patterns of a plurality of cells in which the selected cell including the first pattern and the second pattern, which have been subjected to the first optical proximity correction, and another of the cells are proximately arranged; and generating the pattern including the patterns of the plurality of cells which have been subjected to the second optical proximity correction, wherein the exposure method comprises a step of exposing the substrate to light by the electron beam exposure apparatus using data of the generated pattern, wherein the first pattern and the second pattern are drawn on a line pattern extending in one direction formed on the substrate by the electron beam exposure apparatus, wherein the line pattern is cut by the drawn first pattern and the drawn second pattern.

12. An exposure method comprising:

generating data of a pattern used for an electron beam exposure apparatus using the generation method according to claim 11, and exposing a substrate to light by the electron beam exposure apparatus using the generated data of the pattern.

* * * * *